(12) United States Patent
Bullock et al.

(10) Patent No.: US 10,787,538 B2
(45) Date of Patent: Sep. 29, 2020

(54) POLYMERS FOR ORGANIC PHOTOVOLTAICS

(71) Applicant: PHILLIPS 66 COMPANY, Houston, TX (US)

(72) Inventors: Joe Bullock, Bartlesville, OK (US);
Brian Worfolk, Bartlesville, OK (US);
Taeshik Earmme, Seoul (KR);
Hualong Pan, Bartlesville, OK (US);
Kathy Woody, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 40 days.

(21) Appl. No.: 16/254,018

(22) Filed: Jan. 22, 2019

(65) Prior Publication Data

US 2019/0233578 A1    Aug. 1, 2019

Related U.S. Application Data

(60) Provisional application No. 62/623,290, filed on Jan. 29, 2018.

(51) Int. Cl.
*C08G 61/12* (2006.01)
*H01L 51/42* (2006.01)
*H01L 51/00* (2006.01)

(52) U.S. Cl.
CPC ........ *C08G 61/126* (2013.01); *H01L 51/0036* (2013.01); *H01L 51/0043* (2013.01);
(Continued)

(58) Field of Classification Search
CPC ............ C08G 61/126; C08G 2261/149; C08G 2261/3223; C08G 2261/3246;
(Continued)

(56) References Cited

U.S. PATENT DOCUMENTS

2011/0127512 A1* 6/2011 Goto ................... H01L 51/0036
257/40
2013/0161567 A1* 6/2013 Mitchell .............. C08G 61/126
252/500
(Continued)

OTHER PUBLICATIONS

Lee et al. "Two-Dimensionally Extended π-Conjugation of Donor-Acceptor Copolymers via Oligothienyl Side Chains for Efficient Polymer Solar Cells", Macromolecules 2015, pp. 1723-1735; PDF available from ACS Publications. (Year: 2015).*

*Primary Examiner* — Katie L. Hammer
(74) *Attorney, Agent, or Firm* — Phillips 66 Company

(57) ABSTRACT

A polymer comprising:

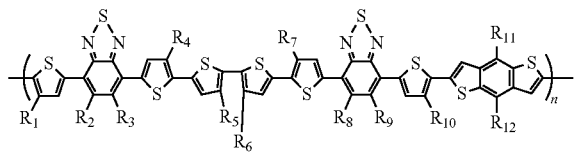

In this polymer $R_1$, $R_2$, $R_3$, $R_4$, $R_5$, $R_6$, $R_7$, $R_8$, $R_9$ and $R_{10}$ are independently selected from H, F, Cl, S, CN, or substituted, unsubstituted, straight-chain, branched, or cyclic alkyls ranging from 1 to 100 carbon atoms. The length of the polymer can range with n from about 1 to about 100,000 repeat units.

3 Claims, 9 Drawing Sheets

(52) U.S. Cl.
CPC .... *H01L 51/4253* (2013.01); *C08G 2261/149* (2013.01); *C08G 2261/3223* (2013.01); *C08G 2261/3246* (2013.01); *C08G 2261/411* (2013.01); *C08G 2261/414* (2013.01); *C08G 2261/91* (2013.01); *H01L 51/0047* (2013.01)

(58) Field of Classification Search
CPC ........ C08G 2261/411; C08G 2261/414; C08G 2261/91; H01L 51/0036; H01L 51/0074; H01L 51/4253
See application file for complete search history.

(56) References Cited

U.S. PATENT DOCUMENTS

| | | | | |
|---|---|---|---|---|
| 2014/0166942 | A1* | 6/2014 | Izawa | H01L 51/0036 |
| | | | | 252/511 |
| 2017/0301862 | A1* | 10/2017 | Yan | H01B 1/127 |
| 2018/0006228 | A1* | 1/2018 | Lee | H01L 51/0043 |

* cited by examiner

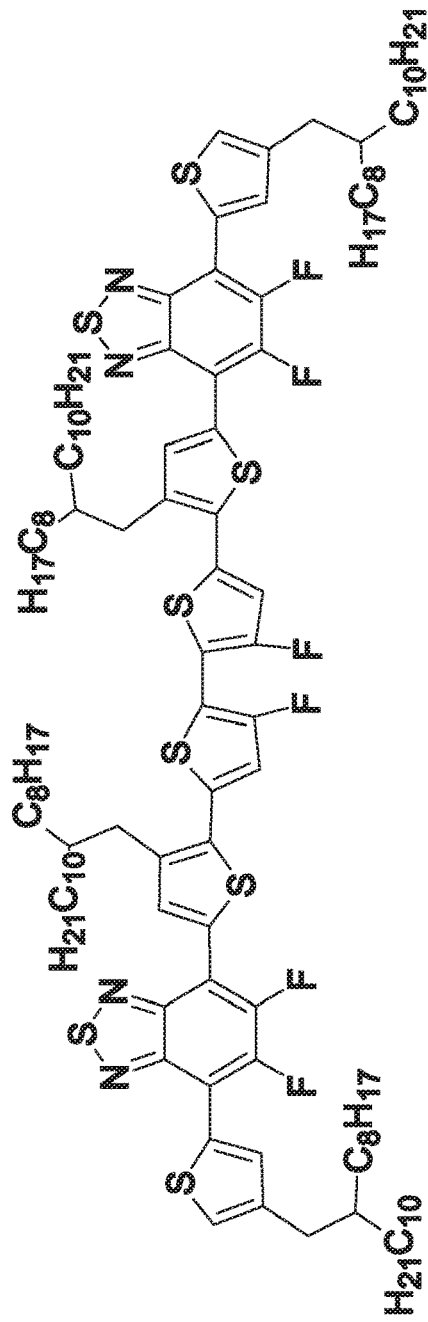
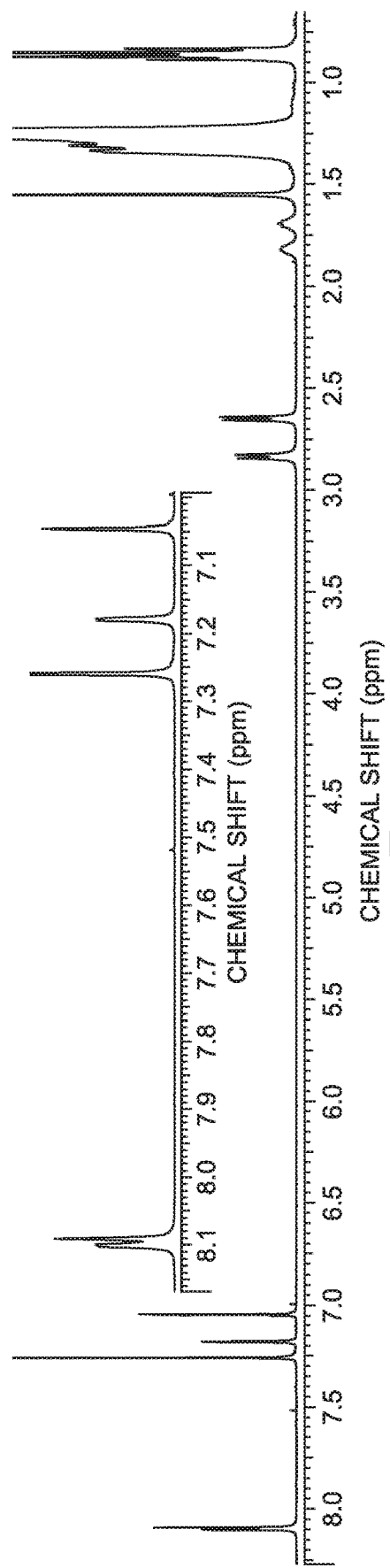
FIG. 2

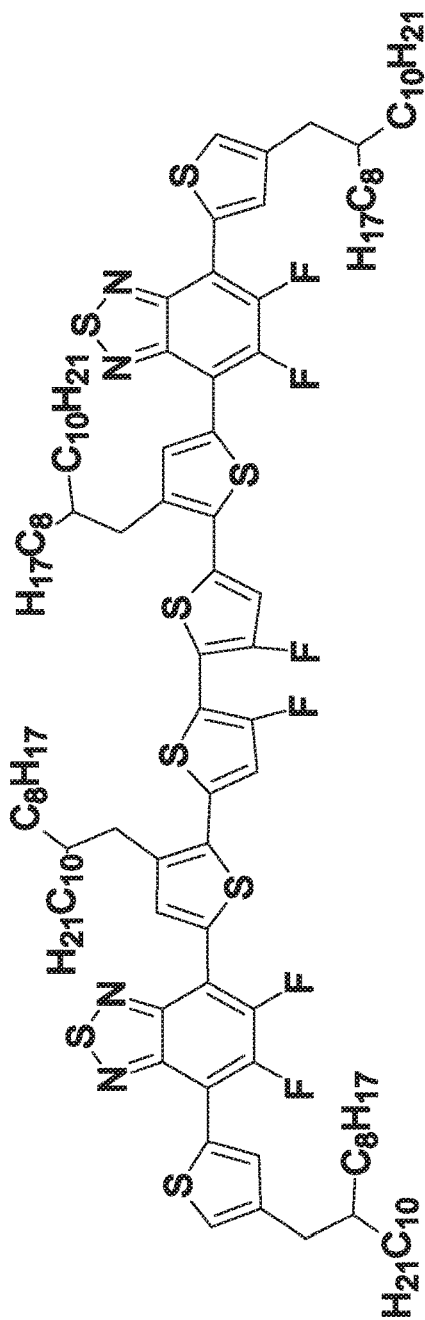
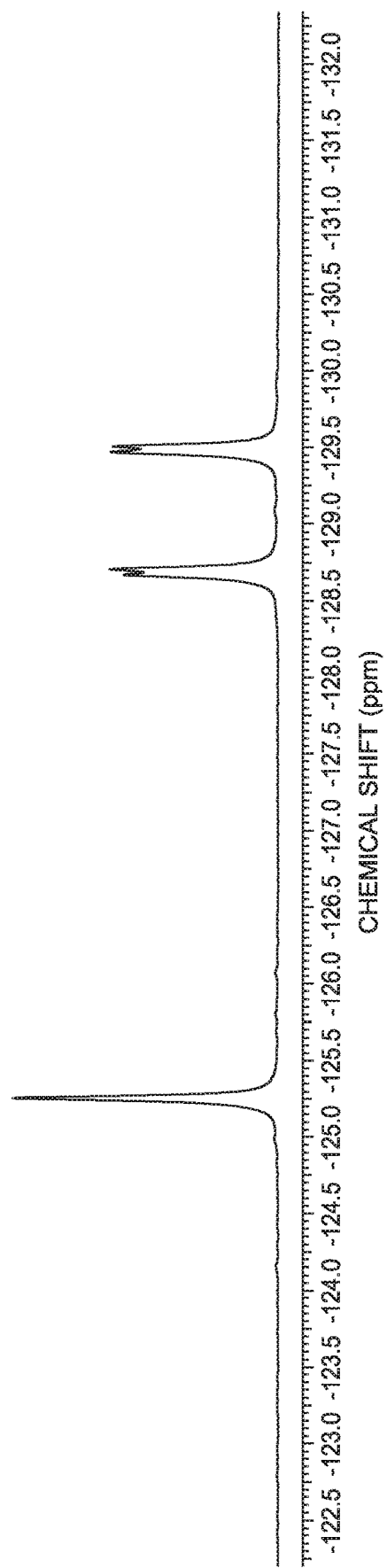
FIG. 3

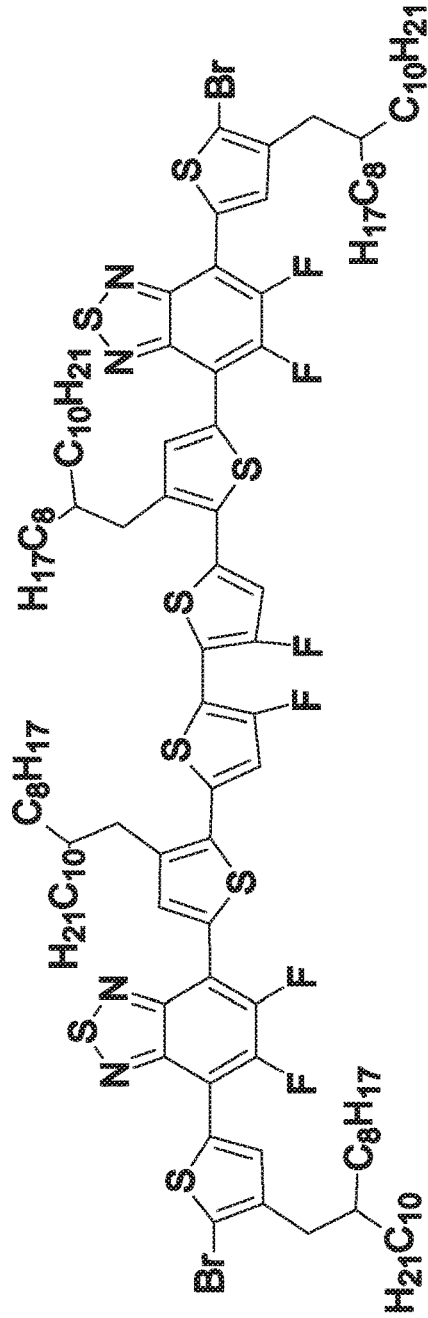
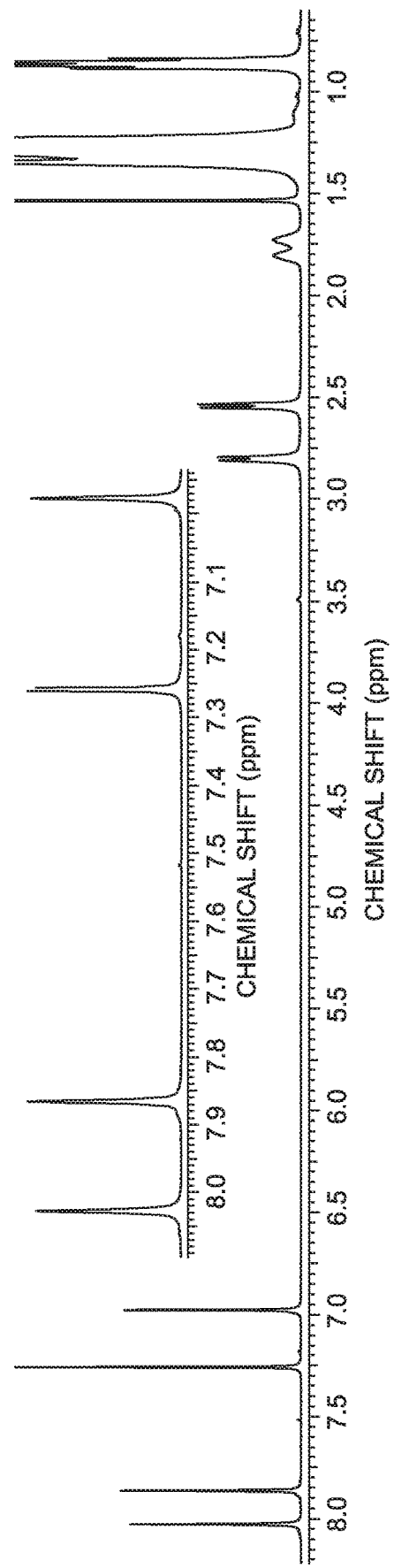
FIG. 4

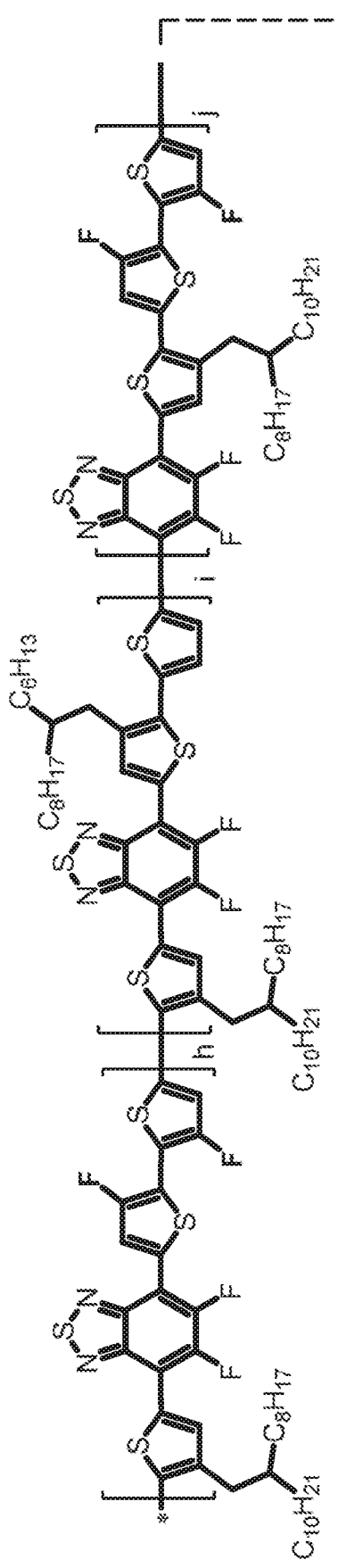
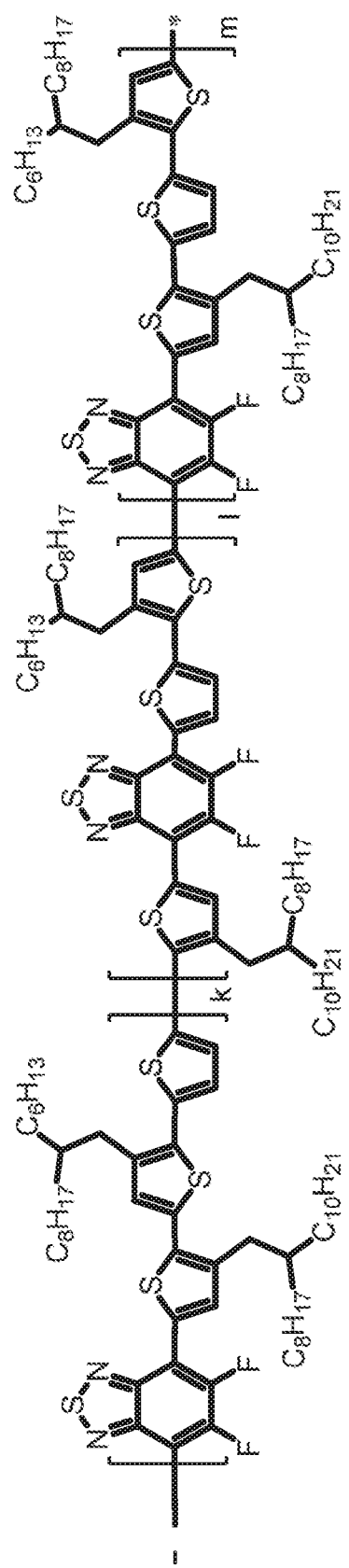
FIG. 6

POLYMERS FOR ORGANIC PHOTOVOLTAICS

CROSS-REFERENCE TO RELATED APPLICATIONS

This application is a non-provisional application which claims the benefit of and priority to U.S. Provisional Application Ser. No. 62/623,290 filed Jan. 29, 2018, titled "Polymers for Organic Photovoltaics," which is hereby incorporated by reference in its entirety.

STATEMENT REGARDING FEDERALLY SPONSORED RESEARCH OR DEVELOPMENT

None.

FIELD OF THE INVENTION

This invention relates to polymers for organic photovoltaics.

BACKGROUND OF THE INVENTION

Solar energy using photovoltaics requires active semiconducting materials to convert light into electricity. Currently, solar cells based on silicon are the dominating technology due to their high-power conversion efficiency. Recently, solar cells based on organic materials showed interesting features, especially on the potential of low cost in materials and processing.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low power conversion efficiency (the ratio of incident photons to energy generated) and poor film forming ability.

There exists a need for a polymer to create organic photovoltaic cells that has high solution extinction coefficients, superior film forming ability and high photovoltaic performance.

BRIEF SUMMARY OF THE DISCLOSURE

A polymer comprising:

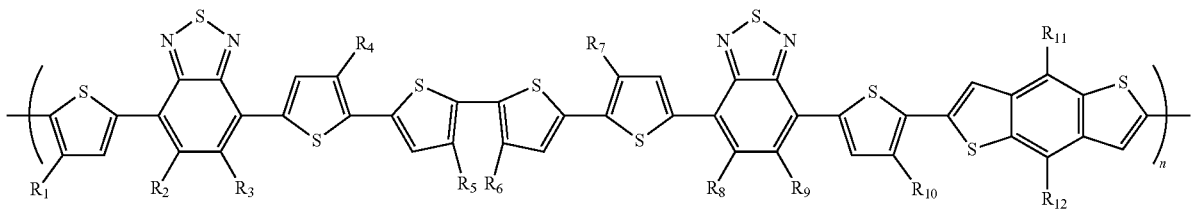

In this polymer $R_1$, $R_2$, $R_3$, $R_4$, $R_5$, $R_6$, $R_7$, $R_8$, $R_9$ and $R_{10}$ are independently selected from H, F, Cl, S, CN, or substituted, unsubstituted, straight-chain, branched, or cyclic alkyls ranging from 1 to 100 carbon atoms. The length of the polymer can range with n from about 1 to about 100,000 repeat units.

In another embodiment, the polymer can comprise:

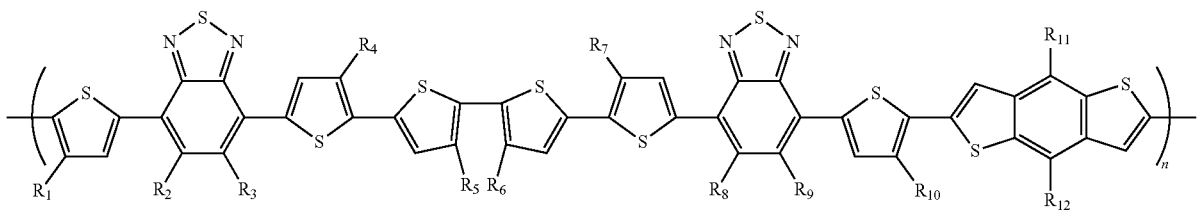

In this polymer $R_1$, $R_4$, $R_7$, and $R_{10}$ are independently selected from H, or substituted, unsubstituted, straight-chain, branched, or cyclic alkyls ranging from 1 to 100 carbon atoms. Additionally, in this polymer $R_2$, $R_3$, $R_5$, $R_6$, $R_8$ and $R_9$ are independently selected from F, Cl, S, Br, or I. Also, in this polymer $R_{11}$ and $R_{12}$ are independently selected from H, substituted and unsubstituted aryls, or substituted, unsubstituted, straight-chain, branched, or cyclic alkyls ranging from 1 to 100 carbon atoms. The length of the polymer can range with n from about 1 to about 100,000 repeat units.

In another embodiment, the polymer can comprise:

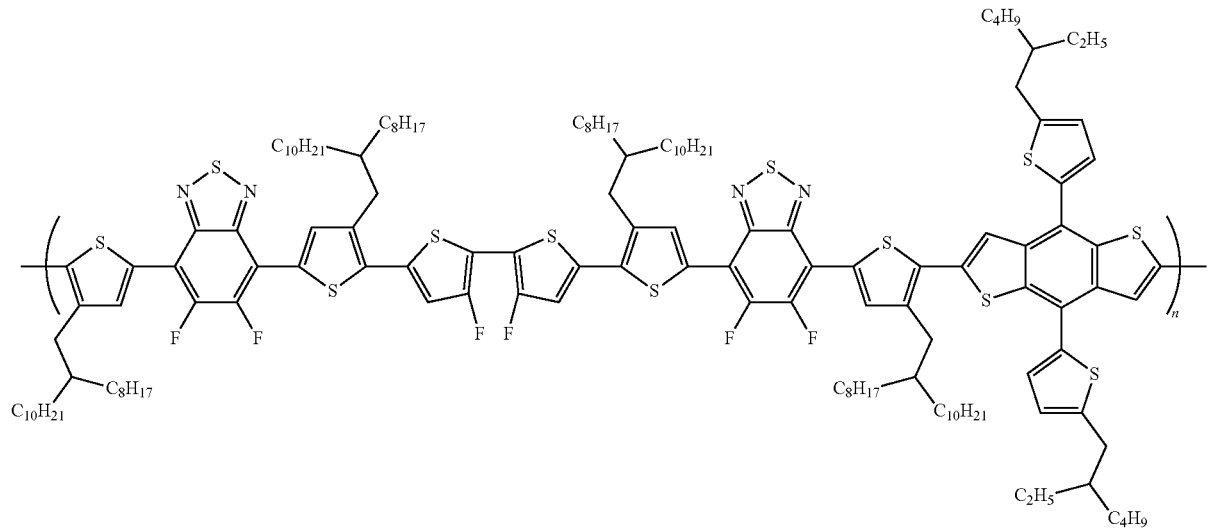

In this embodiment n can range from about 1 to about 100,000 repeat units.

BRIEF DESCRIPTION OF THE DRAWINGS

A more complete understanding of the present invention and benefits thereof may be acquired by referring to the follow description taken in conjunction with the accompanying drawings in which:

FIG. 2 depicts $^1$H of compound 2.

FIG. 3 depicts $^{19}$F NMR of compound 2.

FIG. 4 depicts $^1$H of compound 3.

FIG. 6 depicts Polymer F.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment, the aliphatic hydrocarbon chains are of 1 to about 100 carbon atoms, preferably 1 to 30 carbon atoms, more preferably, 1 to 20 carbon atoms, and even more preferably, and includes straight and branched chains such as methyl, ethyl, n-propyl, isopropyl, n-butyl, isobutyl, sec-butyl, t-butyl, n-pentyl, isopentyl, neo-pentyl, n-hexyl, and isohexyl. In this application alkyl groups can include the possibility of substituted and unsubstituted alkyl groups.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

"Ester", as used herein, represents a group of formula —COOR wherein R represents an "alkyl", "aryl", a "heterocycloalkyl" or "heteroaryl" moiety, or the same substituted as defined above "Ketone" as used herein, represents an organic compound having a carbonyl group linked to a carbon atom such as —C(O)Rx wherein Rx can be alkyl, aryl, cycloalkyl, cycloalkenyl or heterocycle.

"Amide" as used herein, represents a group of formula "—C(O)NR$^x$R$^y$," wherein R$^x$ and R$^y$ can be the same or independently H, alkyl, aryl, cycloalkyl, cycloalkenyl or heterocycle.

The following examples of certain embodiments of the invention are given. Each example is provided by way of explanation of the invention, one of many embodiments of the invention, and the following examples should not be read to limit, or define, the scope of the invention.

Device Architecture

Figure 1:
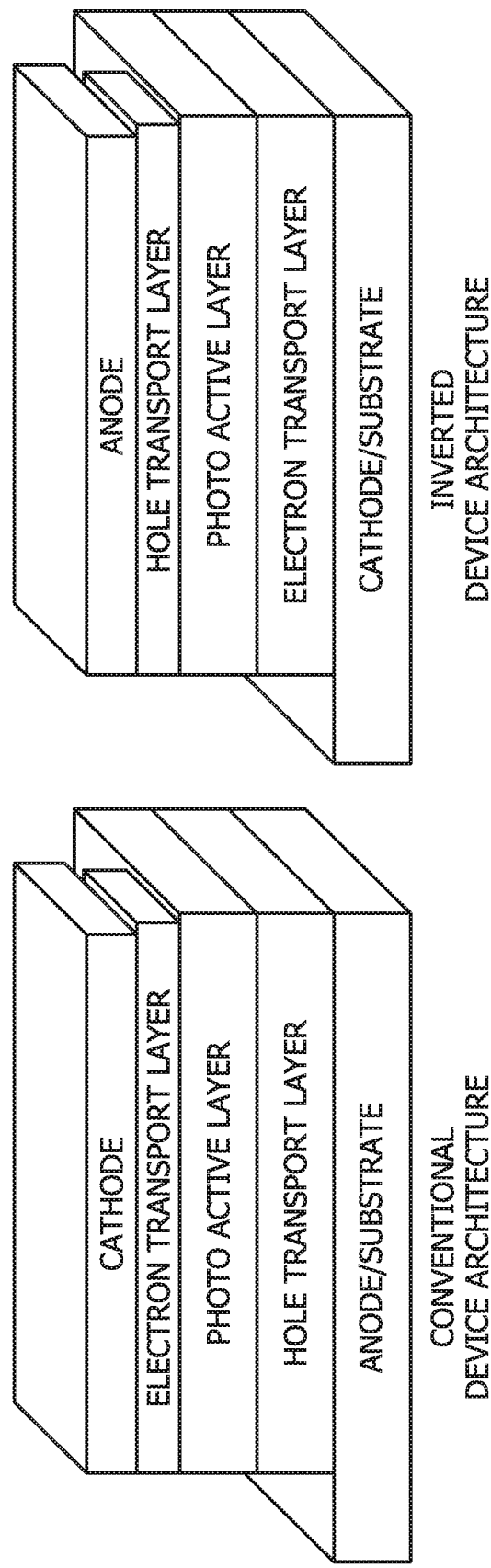
FIG. 1 depicts a conventional device architecture and an inverted device architecture.

When used as a photovoltaic device the architecture may be a conventional architecture device, while in others it may be an inverted architecture device. A conventional architecture device typically comprised of multilayered structure with a transparent anode as a substrate to collect positive charge (holes) and a cathode to collect negative charge (electrons), and a photo-active layer sandwiched in between two electrodes. An additional charge transport interlayer is inserted in between active layer and electrode for facile hole and electron transport. Each charge transport layer can be consisted of one or more layers. An inverted device has the same multilayered structure as the conventional architecture device whereas it uses a transparent cathode as a substrate to collect electrons and an anode to collect holes. The inverted device also has the photo-active layer and additional charge transport layers sandwiched in between two electrodes. FIG. 1 depicts a conventional device architecture and an inverted device architecture.

Polymer

In one embodiment, the polymer can comprise:

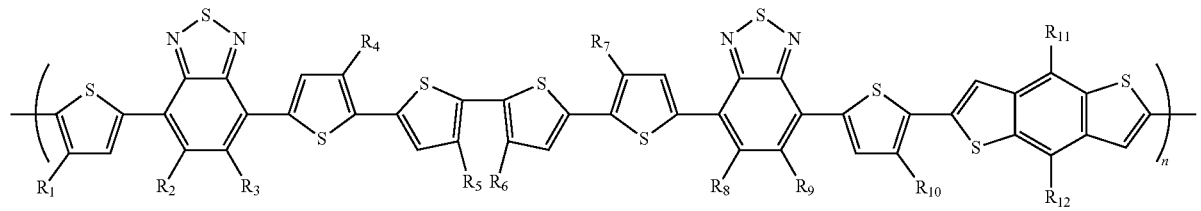

In one embodiment, $R_1$, $R_2$, $R_3$, $R_4$, $R_5$, $R_6$, $R_7$, $R_8$, $R_9$ and $R_{10}$ are independently selected from H, F, Cl, S, CN, or substituted, unsubstituted, straight-chain, branched, or cyclic alkyls ranging from 1 to 100 carbon atoms. The length of the polymer can range with n from about 1 to about 100,000 repeat units.

In this embodiment, $R_1$, $R_4$, $R_7$, and $R_{10}$ can be independently selected from H, or substituted, unsubstituted, straight-chain, branched, or cyclic alkyls ranging from about 1 to about 100 carbon atoms. In one variation of the embodiment, $R_1$, $R_4$, $R_7$, and $R_{10}$ can be identical to each other or in another variation $R_1$, $R_4$, $R_7$, and $R_{10}$ can be different from each other. In one non-limiting example $R_1$, $R_4$, $R_7$, and $R_{10}$ can be independently selected from unsubstituted branched alkyls ranging from about 1 to about 40 carbon atoms.

Additionally, in this embodiment, $R_2$, $R_3$, $R_5$, $R_6$, $R_8$ and $R_9$ can be independently selected from F, Cl, S, Br, or I. In one variation of the embodiment, $R_2$, $R_3$, $R_5$, $R_6$, $R_8$ and $R_9$ can be identical to each other or in another variation $R_2$, $R_3$, $R_5$, $R_6$, $R_8$ and $R_9$ can be different from each other. In one non-limiting example $R_2$, $R_3$, $R_5$, $R_6$, $R_8$ and $R_9$ can be F.

Another feature of this embodiment can have $R_{11}$ and $R_{12}$ independently selected from H, substituted and unsubstituted aryls or, substituted, unsubstituted, straight-chain, branched, or cyclic alkyls ranging from about 1 to about 100 carbon atoms. In one variation of the embodiment, $R_{11}$ and $R_{12}$ can be identical to each other or in another variation $R_{11}$ and $R_{12}$ can be different from each other. In one non-limiting example $R_{11}$ and $R_{12}$ can be selected from a branched thiophene with an unsubstituted branched alkyls ranging from about 1 to about 40 carbon atoms.

In yet another feature of this embodiment, the number of monomer units n in this polymer can range from about 1 to about 100,000 repeat units. In other features of this embodiment, the number of monomer units Z in this polymer can range from about 10 to about 75,000 repeat units, about 100 to about 50,000 repeat units or even from about 1,000 to about 20,000 repeat units.

It is envisioned that this polymer can be regio-regular or regio-random. It is also envisioned that the polymer can be used as a photovoltaic material or as an active layer in an electronic device.

In another embodiment, the polymer can comprise:

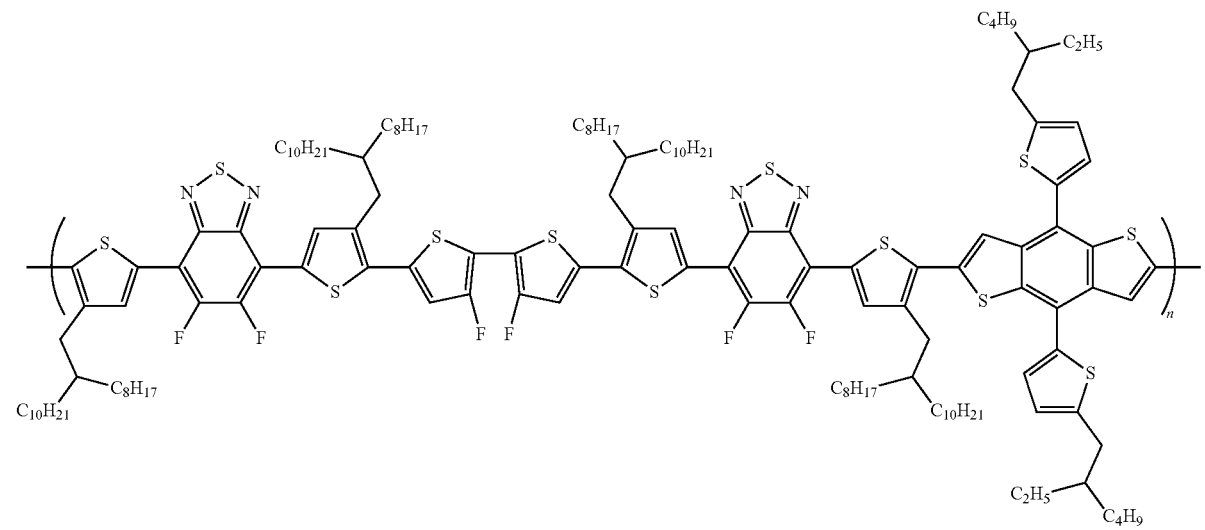

In this embodiment n can range from about 1 to about 100,000 repeat units.

Monomer Synthesis

In one embodiment, the method of synthesizing the polymer begins by first generating the monomer. The method of synthesizing monomers can begin by coupling

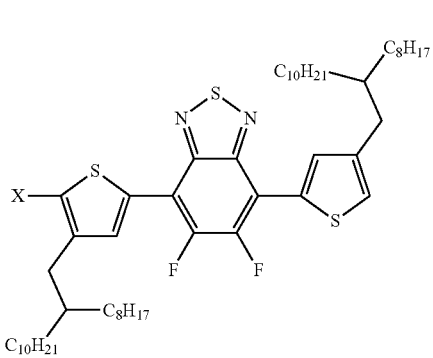

and 5,5-Y-3,3'-difluoro-2,2'-bithiophene to produce

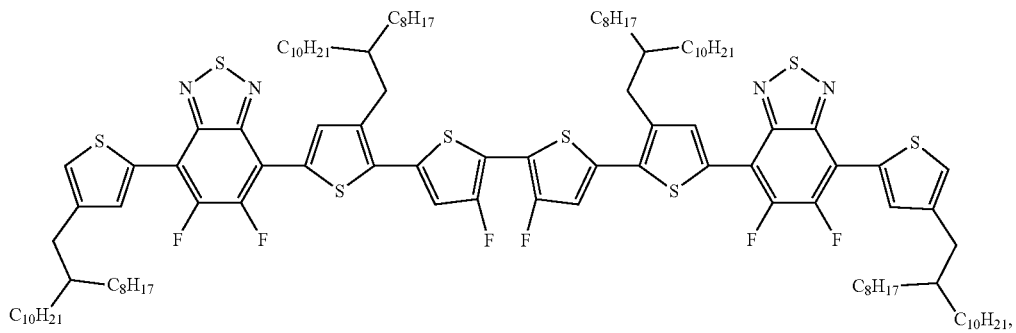

wherein X can be any known compound capable of coupling with the 5,5-Y-3,3'-difluoro-2,2'-bithiophene and Y is selected from the group consisting of Br, a stannyl group, a boronic ester and a H.

The method of synthesizing monomers can also begin by Stille coupling compound 1:

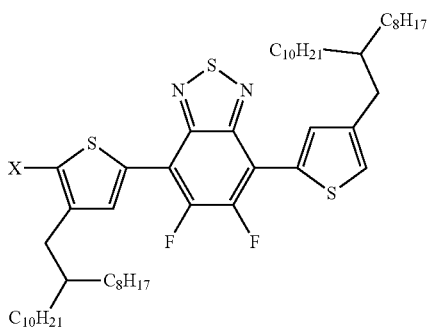

and 3,3'-difluoro-[2,2'-bithiophene]-5,5'-diyl)bis(trimethylstannane). In compound 1, X can be any known compound capable of Stille coupling with the stannane. Non-limiting examples of X can be: Br, Cl, I, or even triflates.

In one embodiment, the Stille coupling of compound 1 and 3,3'-difluoro-[2,2'-bithiophene]-5,5'-diyl)bis(trimethylstannane) occurs in the presence of a palladium catalyst. Non-limiting examples of the Stille coupling procedure can involve taking compound 1 (0.65 g, 0.666 mmol), (3,3'-difluoro-[2,2'-bithiophene]-5,5'-diyl)bis(trimethylstannane) (0.16 g, 0.303 mmol), tri(o-toly)phosphine (0.015 g, 0.048 mmol), and tris(dibenzylideneacetone)dipalladium(0) (0.011 g, 0.012 mmol) and placing them in a dry Schlenk flask. The vessel can be evacuated and backfilled with argon three times. Anhydrous chlorobenzene (28 mL) can be added and the mixture was heated to reflux. The resultant solution can be cooled to room temperature and the solvent can be evaporated under reduced pressure. The residue can then be eluted through a column. The compound 2

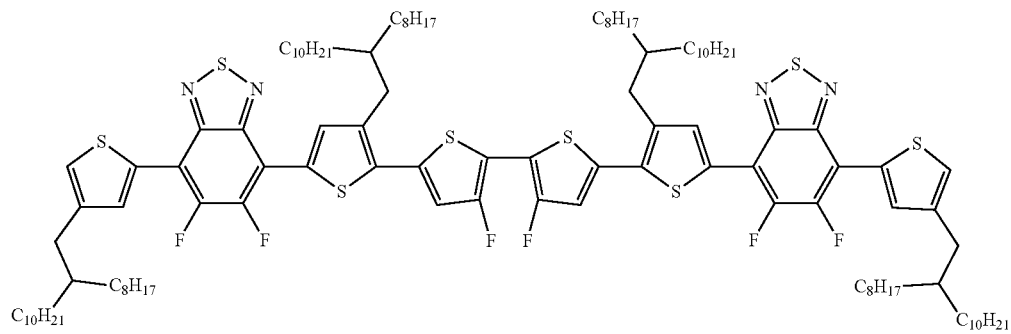

can then be further purified by recrystallization to yield the product as a red wax (0.28 g, 46% yield). The $^1H$ and $^{19}F$ NMRs are shown in FIGS. 2 and 3.

Compound 2 can then be brominated to produce compound 3

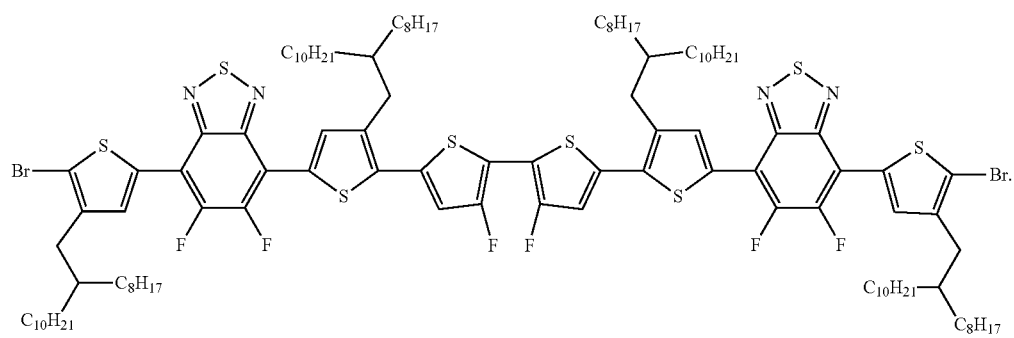

Figure 5:
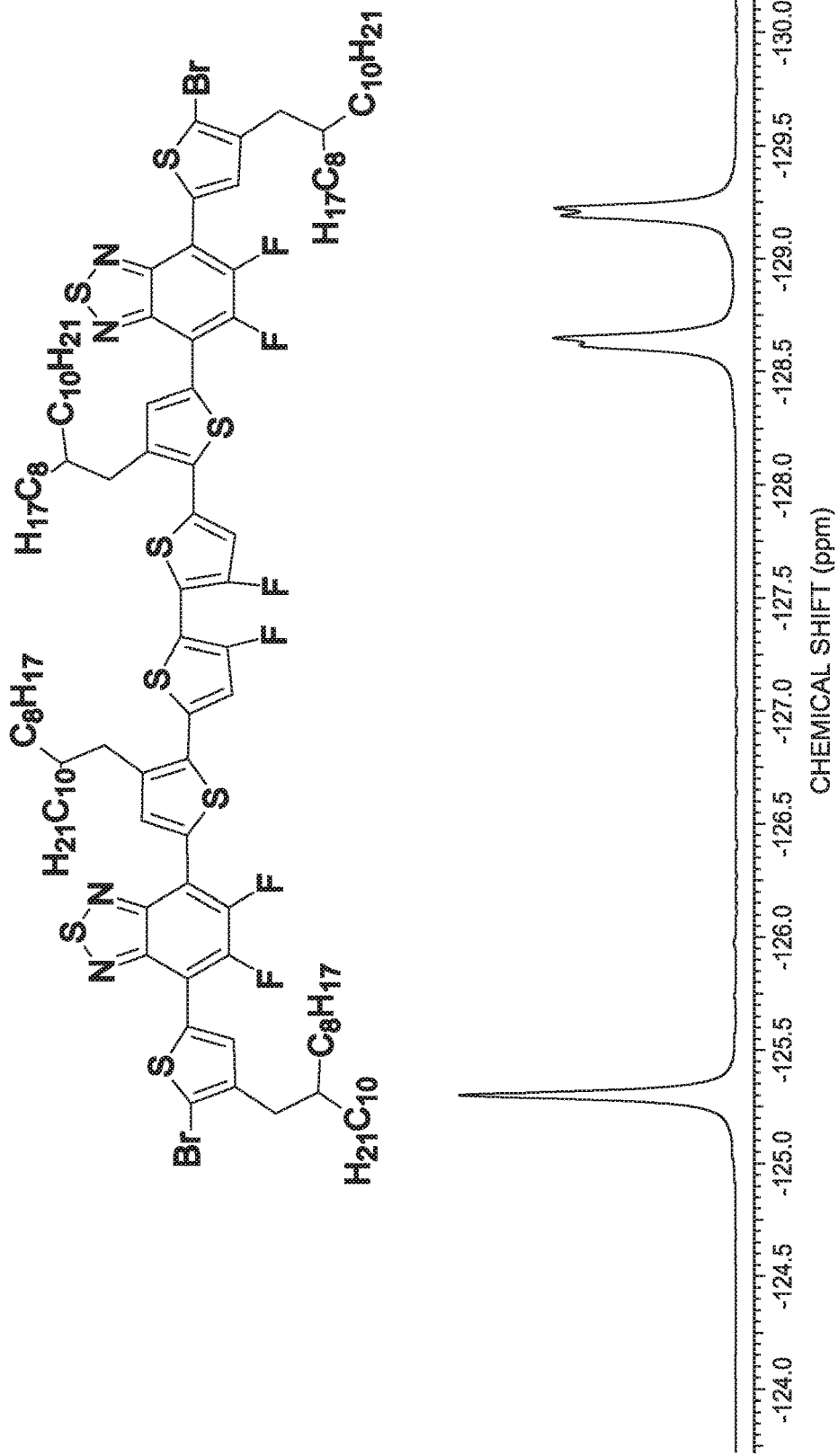
FIG. 5 depicts $^{19}$F NMR of compound 3.

In one non-limiting example, the bromination can occur by taking compound 2 (0.47 g, 0.236 mmol) and dissolved it in anhydrous tetrahydrafuran (10 mL) in a dry Schlenk flask under argon. The solution was cooled to −78° C. in a dry ice/2-propanol bath. N-Bromosuccinimide (0.167 g, 0.944 mmol) was dissolved in anhydrous tetrahydrafuran (5 mL) and added dropwise. The solution was wrapped in foil and stirred allowing the solution to be slowly warmed to room temperature. The solution was then precipitated with methanol and collected by filtration. Once the solid was dried it was dissolved in hexanes and eluted through two inches of silica gel with hexanes to remove impurities and followed by 10 vol % dichloromethane in hexanes to collect compound 3. Compound 3 was further purified by dissolving in hexanes and precipitating with methanol to yield the pure product as a red wax (0.45 g, 90% yield). The $^1H$ and $^{19}F$ NMRs are shown in FIGS. 4 and 5.

Polymer Synthesis

The polymerization can be any conventionally known method of combining the monomers into a covalently bonded chain or network. In one non-limiting example compound 3 can be polymerized using Stille cross coupling, Suzuki cross coupling or direct arylation polymerization.

Anode

When used in as an organic photovoltaic device the polymer can be used in conjunction with an anode. The anode for the organic photovoltaic device can be any conventionally known anode capable of operating as an organic photovoltaic device. Examples of anodes that can be used include: indium tin oxide, aluminum, silver, carbon, graphite, graphene, PEDOT:PSS, copper, metal nanowires, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

When used in as an organic photovoltaic device the polymer can be used in conjunction with a cathode. The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, aluminum, gold, metal nanowires.

Electron Transport Layer

When used in as an organic photovoltaic device the copolymer can be deposited onto an electron transport layer. Any commercially available electron transport layer can be used that is optimized for organic photovoltaic devices. In one embodiment, the electron transport layer can comprise $(AO_x)_yBO_{(1-y)}$. In this embodiment, $(AO_x)_y$ and $BO_{(1-y)}$ are metal oxides. A and B can be different metals selected to achieve ideal electron transport layers. In one embodiment A can be aluminum, indium, zinc, tin, copper, nickel, cobalt, iron, ruthenium, rhodium, osmium, tungsten, magnesium, indium, vanadium, titanium and molybdenum.

In one embodiment B can be aluminum, indium, zinc, tin, copper, nickel, cobalt, iron, ruthenium, rhodium, osmium, tungsten, vanadium, titanium and molybdenum.

Examples of $(AO_x)_yBO_{(1-y)}$ include: $(SnO_x)_yZnO_{(1-y)}$, $(AlO_x)_yZnO_{(1-y)}$, $(AlO_x)_yInO_{z(1-y)}$, $(AlO_x)_ySnO_{z(1-y)}$, $(AlO_x)_yCuO_{z(1-y)}$, $(AlO_x)_yWO_{z(1-y)}$, $(InO_x)_yZnO_{(1-y)}$, $(InO_x)_ySnO_{z(1-y)}$, $(InO_x)_yNiO_{z(1-y)}$, $(ZnO_x)_yCuO_{z(1-y)}$, $(ZnO_x)_yNiO_{z(1-y)}$, $(ZnO_x)_yFeO_{z(1-y)}$, $(WO_x)_yVO_{z(1-y)}$, $(WO_x)_yTiO_{z(1-y)}$, and $(WO_x)_yMoO_{z(1-y)}$.

In an alternate embodiment, various fullerene dopants can be combined with $(AO_x)_yBO_{(1-y)}$ to make an electron transport layer for the organic photovoltaic device. Examples of fullerene dopants that can be combined include

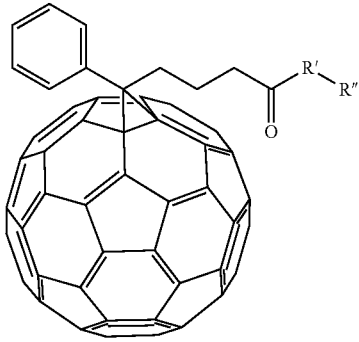

and [6,6]-phenyl-$C_{60}$-butyric-N-2-trimethylammonium ethyl ester iodide.

In the embodiment of

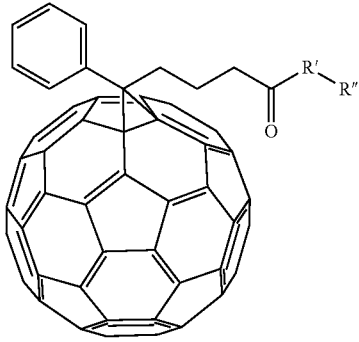

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

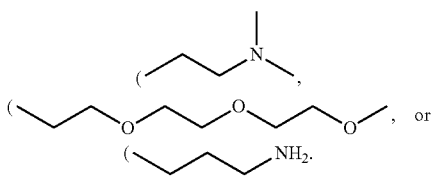

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-$C_{60}$-butyric-N-2-dimethylaminoethyl ester.

Organic Photovoltaic Device Fabrication

Zinc/tin oxide (ZTO):phenyl-$C_{60}$-butyric-N-(2-hydroxyethyl)acetamide (PCBNOH) sol-gel solution was prepared by dissolving zinc acetate dihydrate or tin(II) acetate in 2-methoxyethanol and ethanolamine. Specifically, the ZTO:PCBNOH sol-gel electron transport layer solution was prepared by mixing $Zn(OAc)_2$ (3.98 g), $Sn(OAc)_2$ (398 mg) and PCBNOH (20.0 mg) in 2-methoxyethanol (54 mL) with ethanolamine (996 μL). Solutions were then further diluted to 65 vol % by adding more 2-methoxyethanol and stirred for at least an hour before spin casting onto indium tin oxide substrate to form the electron transport layer.

In alternate embodiments, the formation of ZTO ([6,6]-phenyl-$C_{60}$-butyric-N-2-trimethylammonium ethyl ester iodide (PCBNMI) can be used as well. One method of forming PCBNMI can be taking [6,6]-phenyl-$C_{60}$-butyric-N-2-dimethylaminoethyl ester (0.05 g, 0.052 mmol) and dissolved it in dry THF (2 mL) under argon. Iodomethane (1.5 mL) was added in one portion and the vessel was sealed. The solution is then heated to 60° C. for 18 hours. The solution was cooled and opened to allow the liquids to evaporate. The solid residue was suspended in methanol, diluted with acetone, and centrifuged. This process was repeated to produce [6,6]-phenyl-$C_{60}$-butyric-N-2-trimethylammonium ethyl ester iodide as a metallic green powder (0.05 g, ~99% yield).

The polymer and the acceptor, $PC_{70}BM$, in a ratio of 1:1.2 were dissolved in chlorobenzene at the concentration of 26 mg/mL to obtain the photoactive layer solution. The solution was stirred and heated at 80° C. overnight in a nitrogen filled glove box. The next day 3.0 vol % of 1,8-diiodooctane (DIO) was added before spin-coating of the photoactive layer.

Indium tin oxide patterned glass substrates were cleaned by successive ultra-sonications in acetone and isopropanol. Each 15-min step was repeated twice, and the freshly cleaned substrates were left to dry overnight at 60° C. Preceding fabrication, the substrates were further cleaned for 1.5 min in a UV-ozone chamber and the electron transport layer was immediately spin coated on top.

Sol-gel electron transport layer solution was filtered directly onto the indium tin oxide with a 0.25 μm poly (vinylidene fluoride) filter and spin cast at 4000 rpm for 40 s. Films were then annealed at 170° C. for 15 min, and directly transferred into a nitrogen filled glove box.

The photoactive layer was deposited on the electron transport layer via spin coating at 600 rpm for 40 s with the solution and the substrate being preheated at 110° C. and directly transferred into a glass petri dish for overnight solvent annealing.

After annealing, the substrates were loaded into the vacuum evaporator where $MoO_3$ (hole transport layer) and Ag (anode) were sequentially deposited by thermal evaporation. Deposition occurred at a pressure of $<4\times10^{-6}$ torr. $MoO_3$ and Ag had thicknesses of 5.0 nm and 120 nm, respectively. Samples were then encapsulated with glass using an epoxy binder and treated with UV light for 3 min.

Examples of Polymerization Reactions

Polymer A = 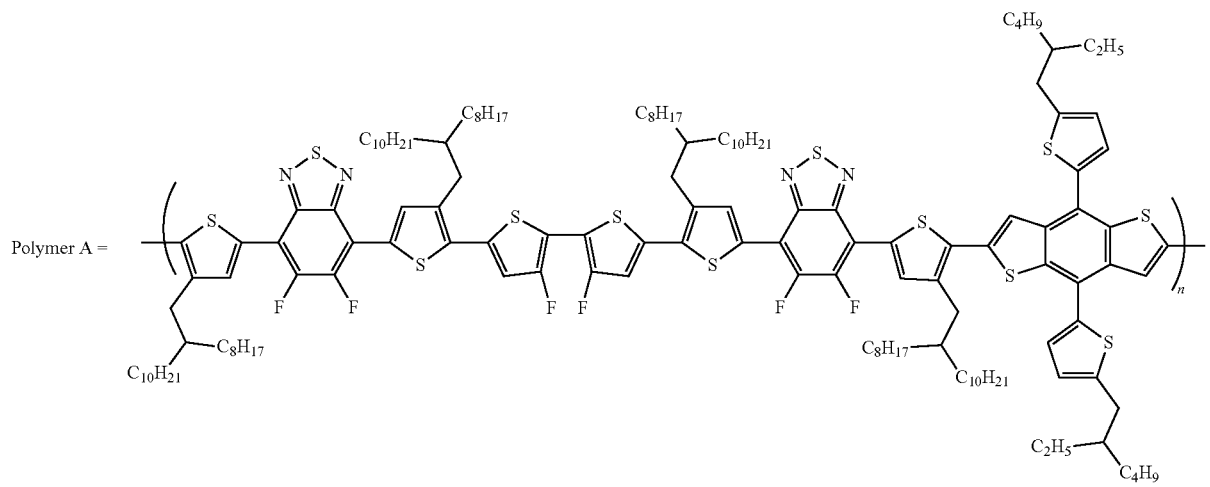

Compound 3 (0.327 g, 0.152 mmol) (4,8-bis(5-(2-ethylhexyl)thiophen-2-yl)benzo[1,2-b:4,5-b']dithiophene-2,6-diyl)bis(trimethylstannane) (0.1377 g, 0.152 mmol), tri(o-toly)phosphine (7.4 mg, 24.4 μmol), and tris(dibenzylideneacetone)dipalladium(0) (5.6 mg, 6.1 μmol) were placed in a dry Schlenk flask. The vessel was evacuated and backfilled with argon. Anhydrous chlorobenzene was added, and the solution was freeze-pump-thawed. The solution was heated to reflux then cooled and precipitated/suspended with acetone. The solid was filtered and subjected to Soxhlet extraction with acetone, followed by hexanes, followed by chloroform, and chlorobenzene. The chloroform and chlorobenzene extracts were concentrated by evaporating the solvent under reduced pressure and precipitating with acetone. The solid polymer A was collected by filtration and dried (88% yield).

Polymer B = 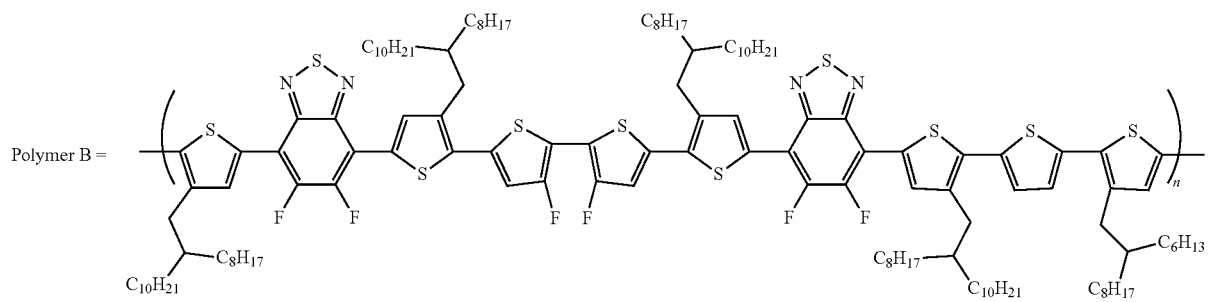

Compound 3 (77.8 mg, 36 μmol), (3-(2-hexyldecyl)-[2,2'-bithiophene]-5,5'-diyl)bis(trimethylstannane) (26 mg, 36 μmol), tri(o-toly)phosphine (1.8 mg, 6.0 μmol), and tris(dibenzylideneacetone)dipalladium(0) (1.3 mg, 1.0 μmol) were placed in a dry Schlenk flask. The vessel was evacuated and backfilled with argon. Anhydrous chlorobenzene was added, and the solution was freeze-pump-thawed. The solution was heated to reflux then cooled and precipitated/suspended with acetone. The solid was filtered into a paper thimble and subjected to Soxhlet extraction with acetone, followed by hexanes, followed by chloroform, and chlorobenzene. The chloroform and chlorobenzene extracts were concentrated by evaporating the solvent under reduced pressure and precipitating with acetone. The solid was collected by filtration and dried (75% yield).

Polymer C =

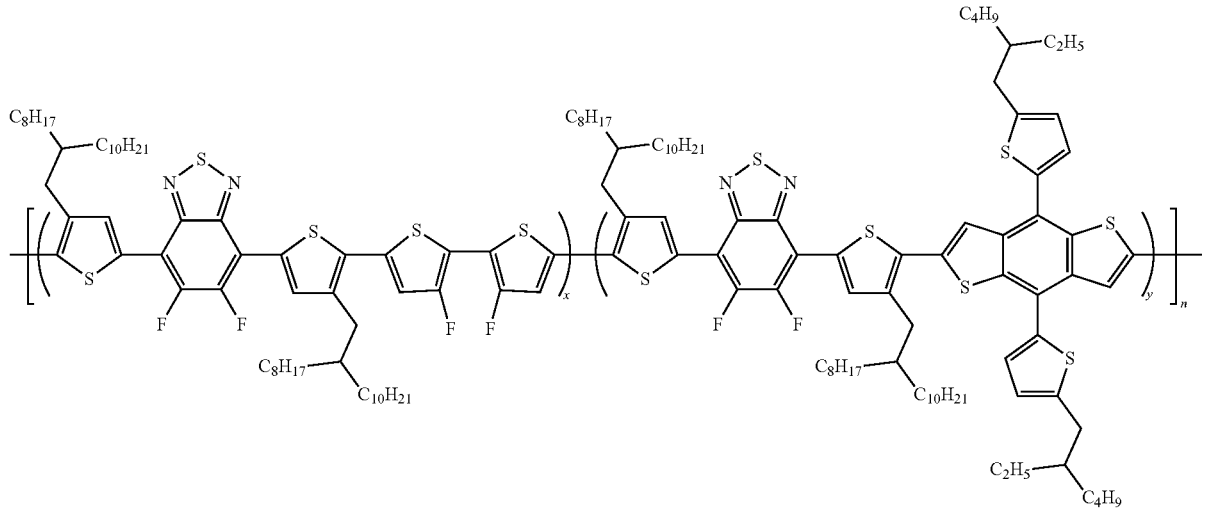

(4,8-bis(5-(2-ethylhexyl)thiophen-2-yl)benzo[1,2-b:4,5-b']dithiophene-2,6-diyl)bis(trimethylstannane) (89.2 mg, 99.0 μmol), (3,3'-difluoro-[2,2'-bithiophene]-5,5'-diyl)bis(trimethylstannane) (52.1 mg, 99.0 μmol) 4,7-bis(5-bromo-4-(2-octyldodecyl)thiophen-2-yl)-5,6-difluorobenzo[c][1,2,5]thiadiazole (208.1 mg, 197.0 μmol), tri(o-toly)phosphine (9.61 mg, 32 μmol), and tris(dibenzylideneacetone)dipalladium(0) (7.2 mg, 8.0 μmol) were placed in a dry Schlenk flask. The vessel was evacuated and backfilled with argon. Anhydrous chlorobenzene was added, and the solution was freeze-pump-thawed. The solution was heated to reflux then cooled and precipitated/suspended with acetone. The solid was filtered into a paper thimble and subjected to Soxhlet extraction with acetone, followed by hexanes, followed by chloroform, and chlorobenzene. The chloroform and chlorobenzene extracts were concentrated by evaporating the solvent under reduced pressure and precipitating with acetone. The solid was collected by filtration and dried (80% yield).

{5-[3-(2-hexyldecyl)-5-(trimethylstannyl)thiophen-2-yl]thiophen-2-yl}trimethylstannane (50.9 mg, 71 μmol), (3,3'-difluoro-[2,2'-bithiophene]-5,5'-diyl)bis(trimethylstannane) (37.5 mg, 71 μmol), 4,7-bis(5-bromo-4-(2-octyldodecyl)thiophen-2-yl)-5,6-difluorobenzo[c][1,2,5]thiadiazole (0.150 g, 142 μmol), tri(o-toly)phosphine (6.9 mg, 23 μmol), and tris(dibenzylideneacetone)dipalladium(0) (5.2 mg, 6.0 μmol) were placed in a dry Schlenk flask. The vessel was evacuated and backfilled with argon. Anhydrous chlorobenzene was added, and the solution was freeze-pump-thawed. The solution was heated to reflux then cooled and precipitated/suspended with acetone. The solid was filtered into a paper thimble and subjected to Soxhlet extraction with acetone, followed by hexanes, followed by chloroform, and chlorobenzene. The chloroform and chlorobenzene extracts were concentrated by evaporating the solvent under reduced pressure and precipitating with acetone. The solid was collected by filtration and dried (85% yield).

Polymer D =

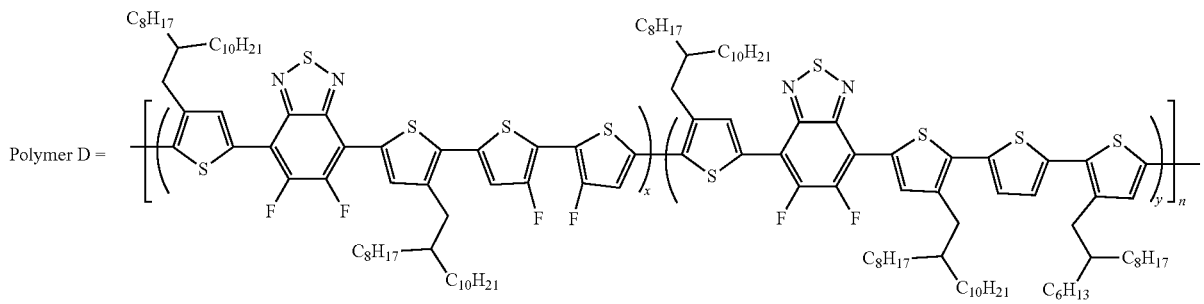

Polymer E = 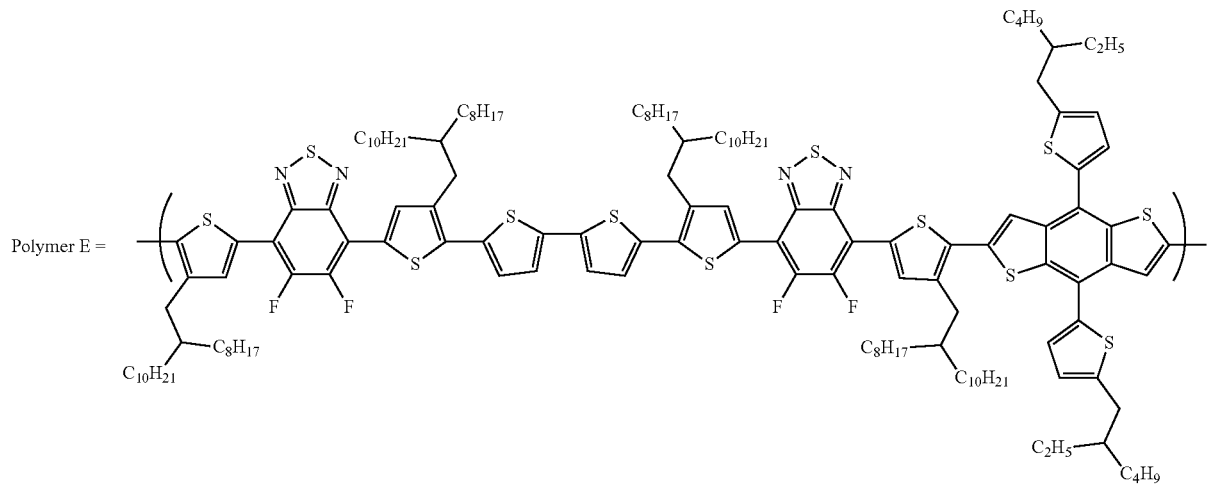

(4,8-bis(5-(2-ethylhexyl)thiophen-2-yl)benzo[1,2-b:4,5-b']dithiophene-2,6-diyl)bis(trimethylstannane) (34.1 mg, 38 µmol), compound

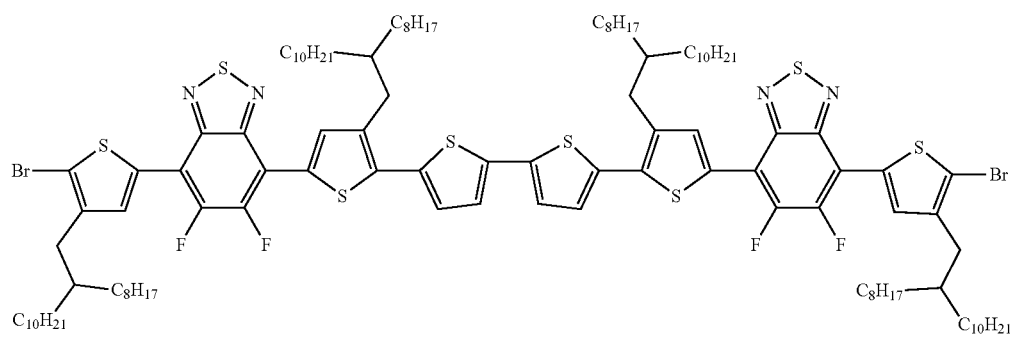

(79.8 mg, 38 µmol), tri(o-toly)phosphine (1.8 mg, 6.0 µmol), and tris(dibenzylideneacetone)dipalladium(0) (1.4 mg, 2.0 µmol) were placed in a dry Schlenk flask. The vessel was evacuated and backfilled with argon. Anhydrous chlorobenzene was added, and the solution was freeze-pump-thawed. The solution was heated to reflux then cooled and precipitated/suspended with acetone. The solid was filtered into a paper thimble and subjected to Soxhlet extraction with acetone, followed by hexanes, followed by chloroform, and chlorobenzene. The chloroform and chlorobenzene extracts were concentrated by evaporating the solvent under reduced pressure and precipitating with acetone. The solid was collected by filtration and dried (41% yield).

Polymer F=Please see FIG. 6

In a 25 mL Schlenk flask, 4-bromo-7-[5-bromo-4-(2-octyldodecyl)thiophen-2-yl]-5,6-difluoro-2,1,3-benzothiadiazole (147.3 mg, 0.213 mmol), [4-(2-hexyldecyl)-5-[5-(trimethylstannyl)thiophen-2-yl]thiophen-2-yl]trimethylstannane (111.1 mg, 0.155 mmol), (3,3'-difluoro-[2,2'-bithiophene]-5,5'-diyl)bis(trimethylstannane) (35.088 mg, 0.066 mmol), Pd2dba3 (4.058 mg, 0.004 mmol) and P(o-tol)3 (5.395 mg, 0.018 mmol) were combined. The mixture was placed under vacuum and backfilled with argon and 2.3 mL of anhydrous chlorobenzene was added. The solution was heated to 130° C. then cooled to room temperature. The product was precipitated by pouring the solution into methanol. The solid was purified by Soxhlet extraction, using acetone, hexane, dichloromethane and chloroform as the solvents. The portion obtained from chloroform was the main product (169 mg, yield 90.2%) after precipitation from methanol and then drying overnight.

Optical Properties

A 10 mg/mL solution of polymer was made by stirring the polymer in chlorobenzene at 80° C. for 18 hours. The solution was cooled to room temperature and deposited on glass by spin coating at 1200 rpm for 40 s. The film was dried under vacuum prior to absorption measurement. The thin film absorption spectra were acquired by using an Agilent Technologies 8453 spectrophotometer.

Figure 7:
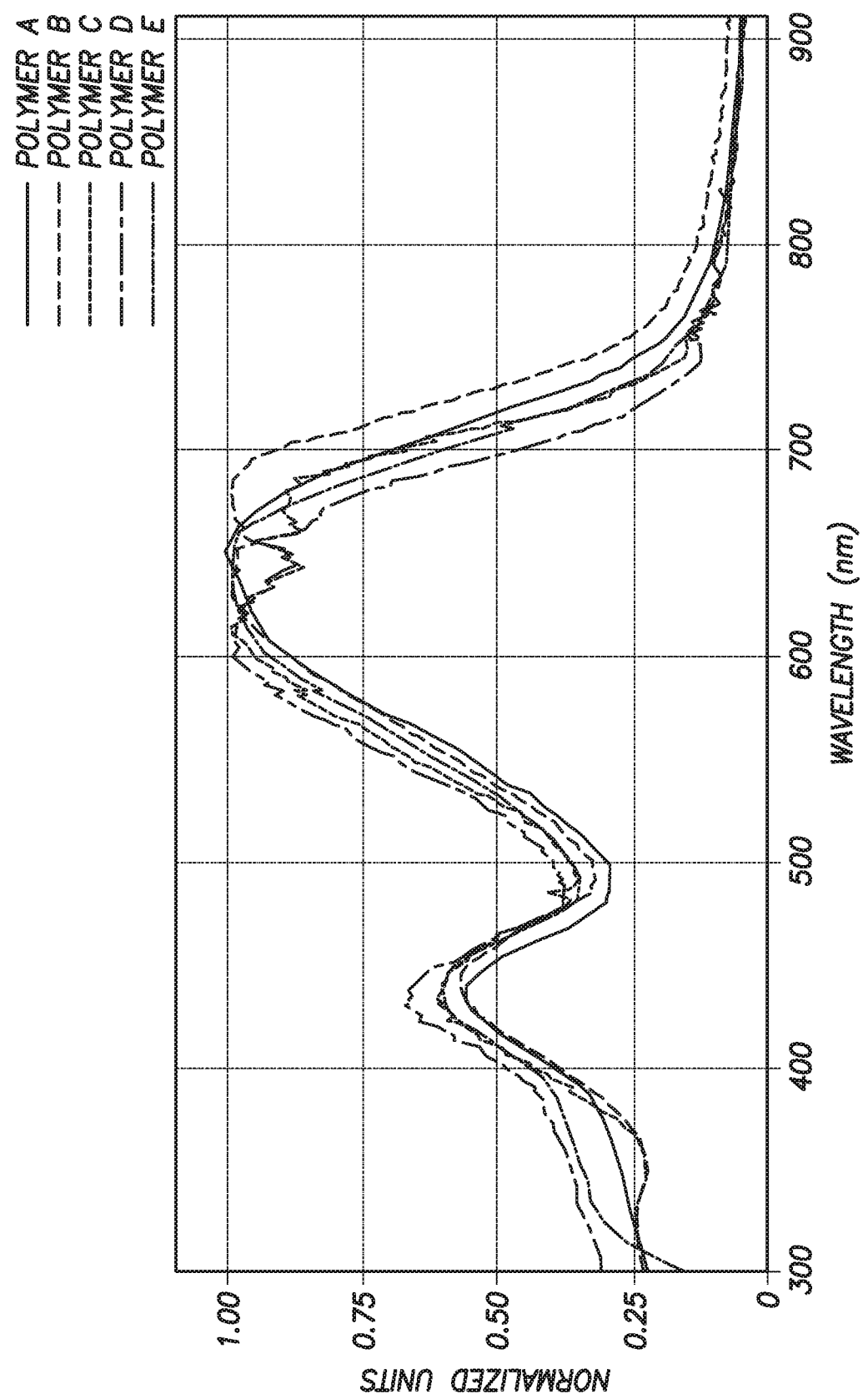
FIG. 7 depicts the thin film UV-visible absorbance of Polymers A, B, C, D and E.

FIG. 7 depicts the thin film UV-visible absorbance of Polymers A, B, C, D and E.

Figure 8:
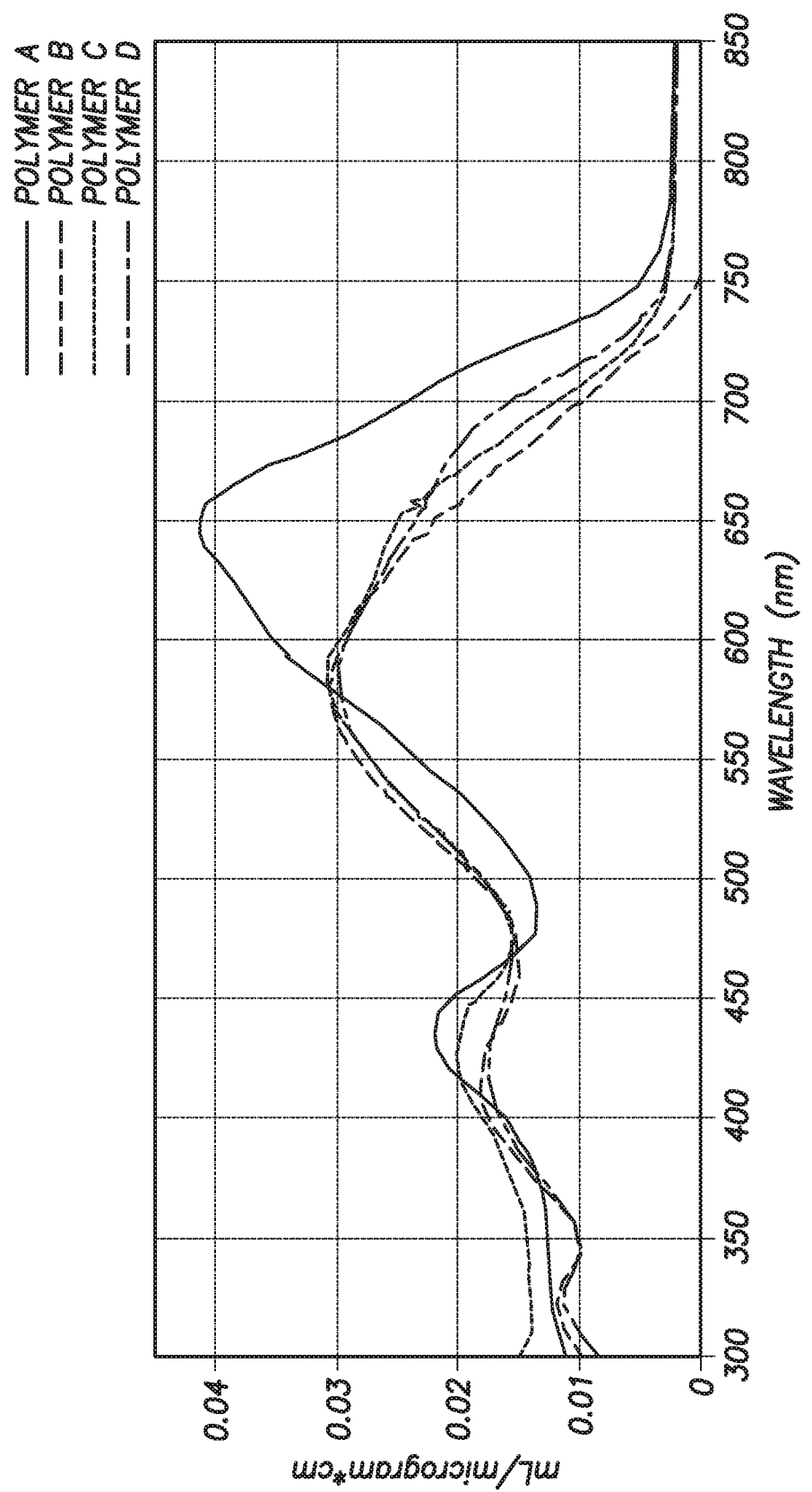
FIG. 8 depicts the solution absorption measurements for Polymers A, B, C, and D.

Solution absorption measurements were also taken for Polymers A, B, C, and D. FIG. 8 depicts the solution absorption of the polymers. The extinction coefficient for Polymer A is much higher compared to the other polymer structures, which may indicate stronger aggregation of the polymer is occurring, even in the solution state.

Film Forming Comparison

Polymers A and F were tested in large area film deposition via slot-die coating. The following describes the fabrication process of films and large area photovoltaic cells.

Electron Transport Layer:

Zinc tin oxide (ZTO): phenyl-$C_{60}$-butyric acid-2-N,N,N-trimethylammonium iodide ethyl ester (PCBNMI) sol-gel solutions were prepared by adding zinc acetate dihydrate (996 mg), tin (II) acetate (99.6 mg), and PCBNOH (5 mg) to 2-methoxyethanol (10 mL) and ethanolamine (249 µL). Solutions were stirred for a minimum of 8 hours before use.

An Erichsen COATMASTER 510 was used to spread the electron transport layer on the large area ITO substrates. Approximately 300 µL of the zinc tin oxide:fullerene (ZTO:PCBNMI) sol-gel solution was drawn into a pipette and deposited without filtration, directly onto the ITO at room temperature. A blade, with a gap height set at 300 µm, was then drawn through the ZTO:PCBNMI solution and across the ITO at a printing speed of 20 mm/s to create a uniform film on the substrate. The films were air dried for 15 min before the substrates were removed from the chuck and annealed at 170° C. for 15 min. The deposited film dimension was 8×10 cm.

Slot-Die Coated Photoactive Layer:

The photoactive layer consisted of either donor polymer Example 1 or 6 and acceptor [6,6]-phenyl-$C_{70}$-butyric acid methyl ester (PCBM). While the examples illustrate an acceptor of PCBM it has been shown that any type of fullerene or non-fullerene acceptor can be used. In non-limiting examples non-fullerene acceptors like 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC) and 3,9-bis(2-methylene-((3-(1,1-dicyanomethylene)-6,7-difluoro)-indanone))-5,5,11,11-tetrakis(4-hexylphenyl)-dithieno[2,3-d:2',3'-d' ]-s-indaceno[1,2-b:5,6-b']dithiophene (ITIC-DF) can be used. For both solutions, the polymer:fullerene ratio was 1:1.6. In Example 1 the ink concentration was 26 mg/mL in 1:1 chlorobenzene:dichlorobenzene with 3 vol % 1,2,4-trichlorobenzene. In Example 6 the ink concentration was 24 mg/mL in 1:1 1,2-dichlorobenzene and 1,2,4-trichlorobenzene. Both solutions were stirred and heated to 110° C. for a minimum of 18 hours. Solutions were cooled to room temperature immediately before using. No filtration was performed.

An FOM Technologies—Compact Sheet Coater was used to slot-die coat the photoactive layer onto the electron transport layer on ITO substrates. The photoactive layer solution was stirred and heated to 110° C. for a minimum of 30 min before drawing several mL through a 1/16" ID FEP tube and into a 5 mL luer lock syringe without filtration. The syringe was placed into the slot-die pump at a syringe diameter setting of 36 mm and the tube was connected to the blade feed. The 1.3 cm wide blade was positioned above the substrate. For printing films containing Polymer A, the coating was performed at 45° C. with a 100 µm gap height, 25 cm/min coating speed and 0.5 mL/min syringe pump speed. For printing films containing Polymer F, the coating was performed at 90° C. with a 250 µm gap height, 150 cm/min coating speed and 0.5 mL/min syringe pump speed. The photoactive layer films were allowed to anneal at the substrate deposition temperature until dry. All films were deposited and annealed in ambient air. The deposited film dimensions were 1.3×10 cm.

Figure 9:
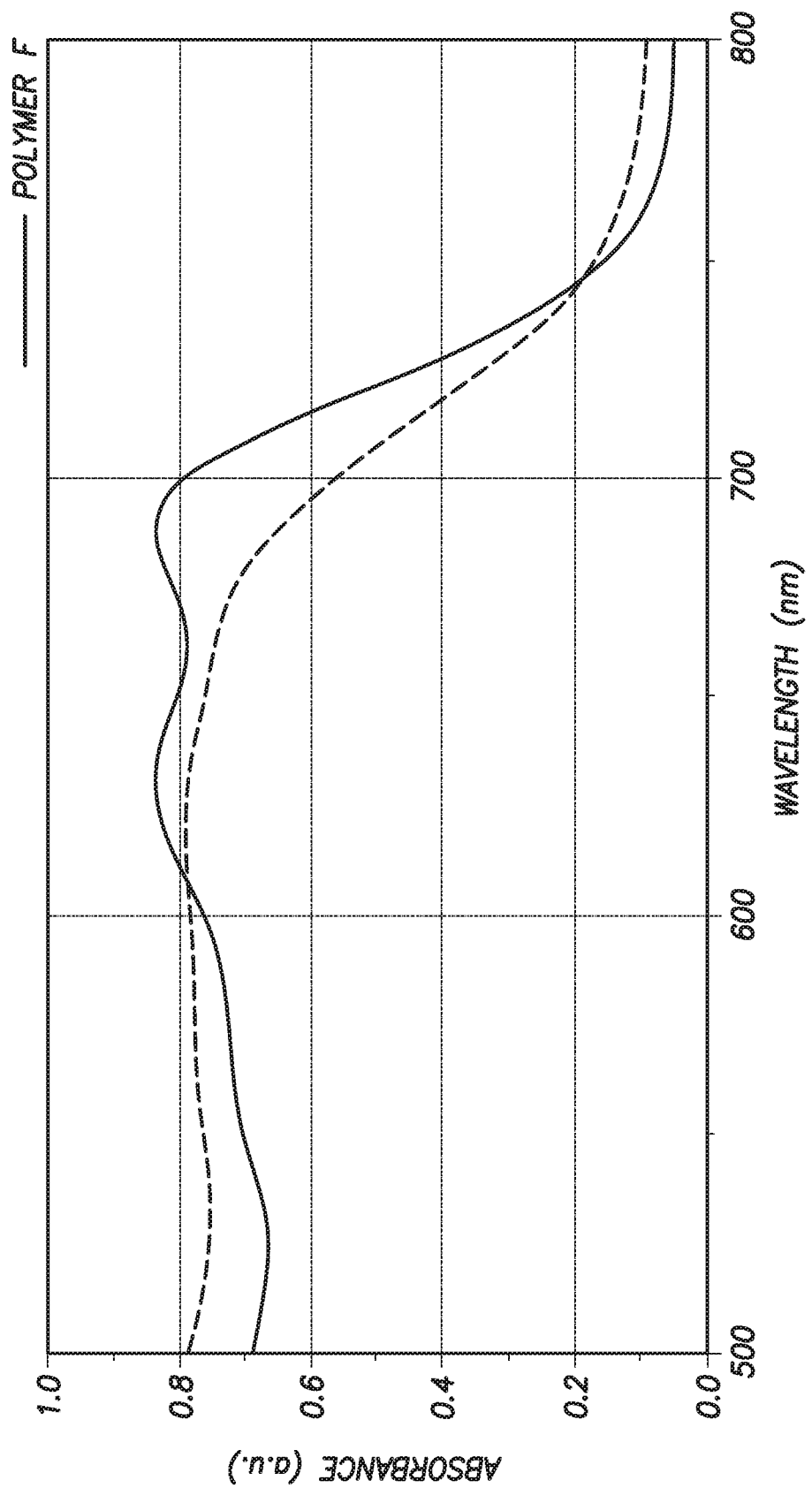
FIG. 9 depicts a comparison of the absorbance of films of Polymer A and Polymer F deposited from slot-die coating.

A comparison of the absorbance of films of Polymer A and Polymer F deposited from slot-die coating are shown on FIG. 9.

Films deposited with the Polymer F have crystallites in the film and areas where the film has dewetted. They areas are likely to lead to electrical shorting in devices and reduce photovoltaic performance. Polymer F appeared to have a greater extent of intermolecular ordering compared to Polymer A.

Large Area OPV Device Evaporation and Testing:

Test 1

After annealing, the substrates were immediately loaded into a Kurt J. Lesker Nano 36 Thin Film Deposition System vacuum evaporator where a mask was fitted to produce three individual devices per substrate. A $MoO_x$ (hole transport layer) and Ag (anode) were sequentially deposited by thermal evaporation. The $MoO_x$ was evaporated from an $Al_2O_3$ crucible supported by a W basket to a final thickness of 3.5 nm. The Ag was evaporated from a W boat to a final thickness of 120 nm. Deposition occurred at a pressure of $2\times10$-6 torr. The deposition rates, 0.5-0.8 Å/s for the $MoO_3$ and 1.5-2.0 Å/s for the Ag, and the final film thicknesses were determined by a Kurt J. Lesker FTM 2400 crystal monitor.

Devices were tested under AM 1.5G 100 mW/cm$^2$ conditions with a Newport Thermal Oriel 91192 1000 W solar simulator (4"×4" illumination size). The active area of the devices was determined by measuring the dimensions of the ITO covered by electron transport layer, photoactive layer, hole transport layer and Ag. The device area is 0.1 cm$^2$. The current density—voltage curves were measured using a Keithley 2400 source meter and voltage scans were taken from −1 V to 2 V. The light intensity was calibrated with a crystalline silicon reference photovoltaic fitted with a KG-5 filter (calibrated by Newport to minimize spectral mismatch).

Both polymer photoactive layer systems were tested in photovoltaic devices. The photovoltaic characteristics are shown in Table 1. Example 6 films which had large crystallite formation and areas of dewetting had an average photovoltaic power conversion efficiency (PCE) of 7.3% for 0.1 cm$^2$ devices. By improving film quality and eliminating film crystallites, the open-circuity voltage ($V_{oc}$) and fill factor (FF) improved. Devices containing Polymer A reached up to 8.3%. These results indicate higher quality films with a reduction in crystallite formation are beneficial to improve the overall power conversion efficiency.

TABLE 1

| Photoactive Layer | $V_{oc}$ (V) | Jsc (mA/cm$^2$) | FF (%) | PCE (%) |
|---|---|---|---|---|
| Polymer F: PCBM | 0.70 | 19.3 | 53.4 | 7.3 |
| Polymer A: PCBM | 0.79 | 19.1 | 55.5 | 8.3 |

Jsc (mA/cm$^2$) Short-circuit current density (Jsc) is the current density that flows out of the solar cell at zero bias. $V_{oc}$ (V) Open-circuit voltage ($V_{oc}$) is the voltage for which the current in the external circuit is zero. Fill factor percentage (FF %) is the ratio of the maximum power point divided by the open circuit voltage and the short circuit current. PCE (%) The power conversion efficiency (PCE) of a photovoltaic cell is the percentage of the solar energy shining on a photovoltaic device that is converted into usable electricity.

Test 2

The photovoltaic performance of large area devices with an active area of 3 cm$^2$ was measured. Photoactive layer films containing either Polymer A or Polymer F with PCBM or ITIC-DF were slot-die coated onto ZTO:PCBNMI ETL-coated ITO substrates that were heated to 45° C. Polymer:PCBM solutions were prepared at a ratio of 1:1.6 in a 1:1 mixture of chlorobenzene:dichlorobenzene with a 3 vol % 1,2,4-trichlorobenzene additive. For solutions containing Polymer A, the total concentration was 26 mg/ml. For solutions containing Polymer F, the total concentration was 24 mg/ml. Polymer:ITIC-DF solutions were prepared using a 1:1 ratio in chlorobenzene with a 3 vol % 1,2,4-trichlorobenzene additive. For solutions containing Polymer A, the total concentration was 24 mg/ml, and for solutions containing Polymer F, the total concentration was 20 mg/ml. All solutions were heated to 80° C. and stirred overnight to dissolve the polymer and acceptor. The solutions were cooled to room temperature before use.

The Polymer A:PCBM solutions were slot-die coated using a gap height of 250 μm, a coating speed of 150 cm/min, and a pump speed of 0.5 ml/min. The Polymer F:PCBM solutions were slot-die coated using a gap height of 100 μm, a coating speed of 25 cm/min, and a pump speed of 0.02 ml/min. The Polymer A:ITIC-DF solutions were slot-die coated using a gap height of 100 μm, a coating speed of 8 cm/min, and a pump speed of 0.02 ml/min. The Polymer F:ITIC-DF solutions were slot-die coated using a gap height of 200 μm, a coating speed of 25 cm/min, and a pump speed of 0.02 ml/min.

Following photoactive layer deposition, a MoOx hole-transport layer and a Ag electrode were thermally evaporated, sequentially, and the photovoltaic performance of the resulting devices was tested. The performance of the large area devices is shown in Table 2. Please note that the performance of PolymerF:PCBM could not be measured due to electrical shorts.

TABLE 2

| Photoactive Layer | $V_{oc}$ (V) | $J_{sc}$ (mA/cm$^2$) | FF (%) | Efficiency (%) |
|---|---|---|---|---|
| Polymer A: PCBM | 0.830 | 9.7 | 63.0 | 4.6 |
| Polymer F: PCBM | — | — | — | — |
| Polymer A: ITIC-DF | 0.812 | 18.2 | 55.6 | 8.0 |
| Polymer F: ITIC-DF | 0.784 | 11.8 | 45.8 | 4.3 |

Jsc (mA/cm$^2$) Short-circuit current density (Jsc) is the current density that flows out of the solar cell at zero bias. $V_{oc}$ (V) Open-circuit voltage ($V_{oc}$) is the voltage for which the current in the external circuit is zero. Fill factor percentage (FF %) is the ratio of the maximum power point divided by the open circuit voltage and the short circuit current. PCE (%) The power conversion efficiency (PCE) of a photovoltaic cell is the percentage of the solar energy shining on a photovoltaic device that is converted into usable electricity.

OPV Device Performance

Patterned indium tin oxide (ITO) coated glass substrates (8-12 Ω) were acquired from Thin Film Devices and cleaned with 15 min ultrasonications successively in acetone, and 2-propanol. The substrates were dried in an oven at 60° C. for at least 2 h. Immediately before use, substrates were further cleaned for 1.5 min with a UV-ozone cleaner.

A ZTO:PCBNMI sol-gel solution was made by adding 1 g of zinc acetate dihydrate (Zn(OAc)$_2$), Sn(OAc)$_2$ (0.1 g), and 5 mg of PCBNMI to a vial. To the vial was added 249 μL of ethanolamine and 10 mL of anhydrous 2-methoxyethanol. The solution was stirred at room temperature for at least 24 hours. The solution was filtered with a 0.2 μm polytetrafluoroethylene (PTFE) syringe filter directly onto a freshly cleaned ITO substrate. ZTO:PCBNMI was spin-cast at 4000 rpm for 40 s and annealed at 170° C. for 15 min in air to form rigid electron transport layer. The substrates were then transferred into a nitrogen filled glovebox.

A photoactive solution consisted of polymer and PCBM in a 1:1.2 or 1:1.6 mass ratio with a fixed concentration in chlorobenzene:dichlorobenzene=1:1 mixture. The solutions were stirred at 80° C. for overnight to fully dissolve the mixture. 1,8-Diiodooctane (3.0 vol %) was added 1 hour before use. The photoactive layer was spin-cast onto the ZTO:PCBNMI ETL coated ITO substrates at 400-1000 rpm for 40 s. The substrates were immediately removed from the spin-coating chuck and placed in a closed glass petri dish for 1 h. The film covering the ITO contact was scratched away, and the devices were loaded into the thermal evaporation chamber. Evaporation was performed at a pressure of <4×10$^{-6}$ mbar. 3.5 nm of MoO$_3$ was deposited at 0.4-0.6 Å/s, and 120 nm of Ag was deposited at 1.5-2.0 Å/s. The devices were encapsulated with UV-curable epoxy and sealed with a glass slide, and exposed to UV light for 3 min.

Devices were tested using a Newport Thermal Oriel 91192 1000 W solar simulator (4"×4" beam size) and current density-voltage plots were measured using a Keithley 2400 source meter. The light source was calibrated to 100 MW/cm$^2$ AM1.5G conditions using a calibrated mono-silicon detector fitted with a KG-5 filter (National Renewable Energy Laboratory) to minimize spectral mismatch.

Devices were fitted with an aperture mask prior to performance measurement. This mask limited the area of the device which is exposed to the simulated sunlight. The area of the aperture mask used was either 0.08212 or 0.08306 cm$^2$.

Table 3 depicts the small area photovoltaic performance of Polymers A-F.

TABLE 3

| Device | PCE (%) | | Jsc (mA/cm$^2$) | | $V_{oc}$ (V) | | FF (%) | |
|---|---|---|---|---|---|---|---|---|
| | Average | Max | Average | Max | Average | Max | Average | Max |
| Polymer A | 11.5 | 11.8 | 19.0 | 19.5 | 0.820 | 0.827 | 73.9 | 75.0 |
| Polymer B | 5.26 | 5.67 | 10.10 | 11.20 | 0.760 | 0.778 | 68.6 | 70.8 |
| Polymer C | 7.26 | 7.77 | 12.90 | 13.60 | 0.820 | 0.829 | 68.6 | 70.8 |
| Polymer D | 7.94 | 8.29 | 15.04 | 16.16 | 0.828 | 0.832 | 63.8 | 66.6 |
| Polymer E | 7.29 | 7.43 | 12.80 | 13.30 | 0.778 | 0.781 | 73.4 | 74.6 |
| Polymer F | 11.89 | 12.04 | 19.82 | 20.18 | 0.805 | 0.810 | 74.6 | 75.8 |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A polymer comprising:

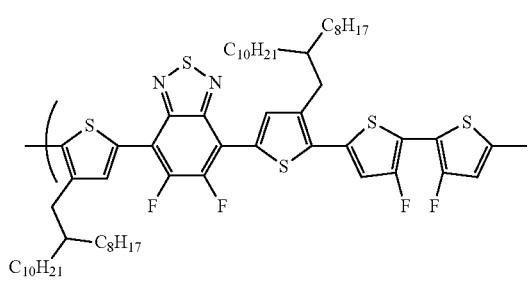

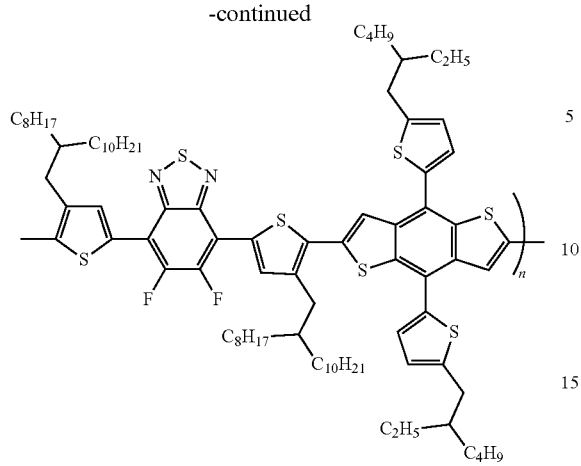
wherein n ranges from 1 to 100,000 repeat units.
2. A photovoltaic device comprising the polymer of claim 1 as a photovoltaic material.
3. An electronic device comprising the polymer of claim 1 as an active layer material.
* * * * *